United States Patent [19]

Kotaka et al.

[11] Patent Number: 5,289,285
[45] Date of Patent: Feb. 22, 1994

[54] CS BROADCAST RECEIVING SYSTEM PROVIDING INCREASED TUNING ACCURACY WHEN RECIVING A CS SOUND BROADCAST SIGNAL

[75] Inventors: Yoshikazu Kotaka; Toru Minematsu, both of Kanagawa, Japan

[73] Assignee: Sony Corporation, Tokyo, Japan

[21] Appl. No.: 920,846

[22] Filed: Jul. 28, 1992

[30] Foreign Application Priority Data

Aug. 5, 1991 [JP] Japan .................. 3-219231

[51] Int. Cl.⁵ .................. H04N 7/20; H04N 5/60
[52] U.S. Cl. .................. 348/138; 455/3.2; 348/725; 348/735
[58] Field of Search .................. 358/188, 191.1, 195.1, 358/197, 198, 193.1; 455/3.2, 196.1, 199.1

[56] References Cited

U.S. PATENT DOCUMENTS

| | | | |
|---|---|---|---|
| 4,974,085 | 11/1990 | Campbell et al. | 358/189 |
| 4,975,775 | 12/1990 | Satoh | 358/198 |
| 5,130,803 | 7/1992 | Kurita et al. | 358/195.1 |

FOREIGN PATENT DOCUMENTS

| | | |
|---|---|---|
| 0492415 | 7/1992 | European Pat. Off. . |
| 0112885 | 5/1984 | Japan . |
| 0179981 | 8/1991 | Japan . |

*Primary Examiner*—James J. Groody
*Assistant Examiner*—Jeffrey S. Murrell
*Attorney, Agent, or Firm*—Hill, Steadman & Simpson

[57] ABSTRACT

In a CS broadcast receiving system, when a station is to be selected, an AFC process is first performed with the frequency in the tuning circuit adjusted in units of a coarse frequency adjustment value for reception of a CS television broadcast signal. When a receive signal to be selected by the tuning circuit is not the CS television broadcast signal, the AFC process is performed with the frequency in the turning circuit adjusted in units of a fine frequency adjustment value for reception of a CS.

With this arrangement, it is made possible to increase the tuning accuracy when tuning in to the CS sound broadcast signal, while the time required for tuning is shortened and the waiting time reduced when tuning in to the CS television broadcast signal and, thereby, both the requirements for reception of the CS sound broadcast signal and for reception of the CS television signal can be satisfied.

1 Claim, 2 Drawing Sheets

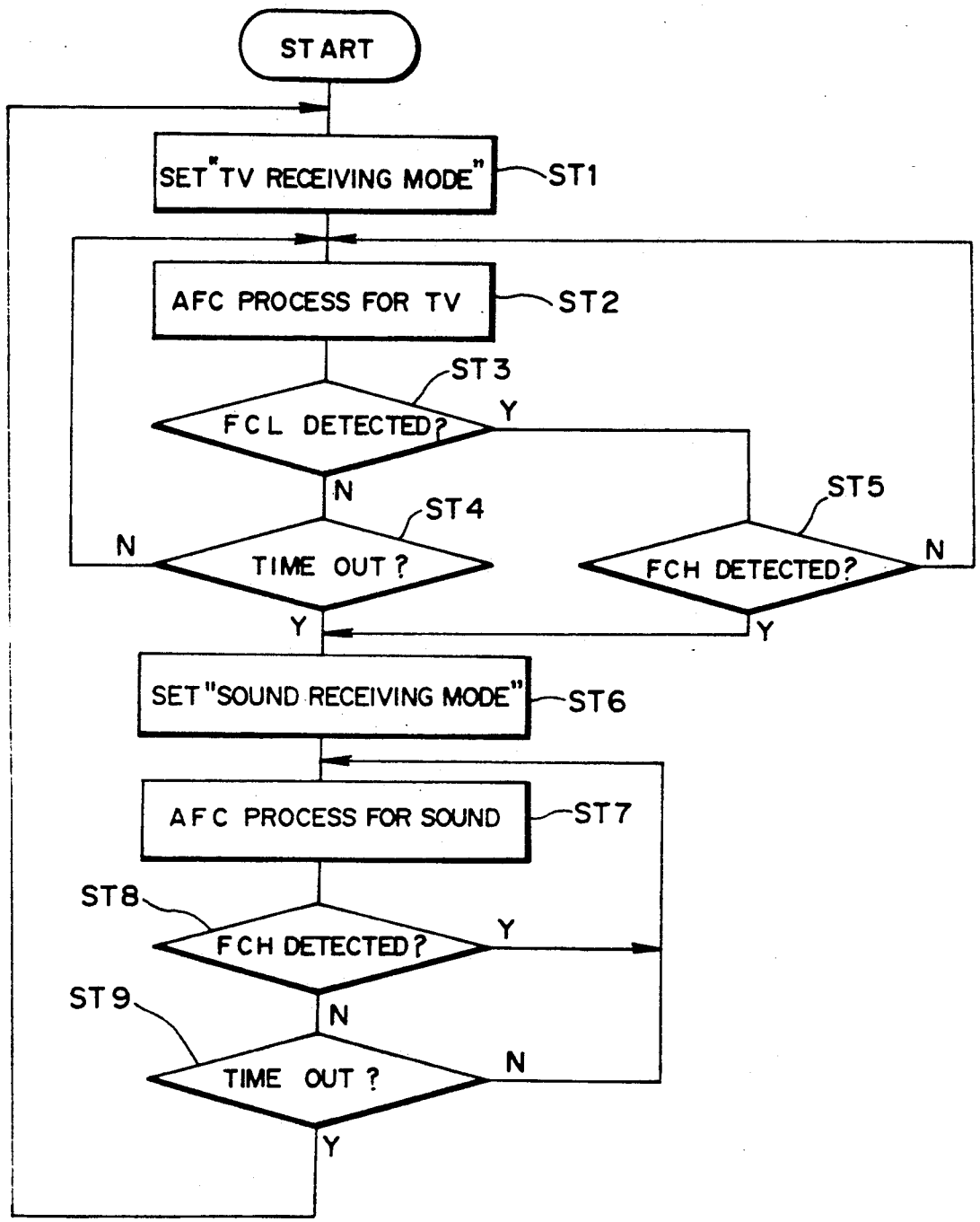

1

CS BROADCAST RECEIVING SYSTEM PROVIDING INCREASED TUNING ACCURACY WHEN RECIVING A CS SOUND BROADCAST SIGNAL

BACKGROUND OF THE INVENTION

1. Field of the Invention

The present invention relates to a CS (Communications Satellite) broadcast receiving system for receiving CS television broadcasting and CS sound broadcasting.

2. Description of the Related Art

In CS television broadcasting in practice today, a picture signal is generated by FM modulation and a subcarrier at 5.73 MHz is set up to generate a sound signal on the QPSK modulation system. The sound signal is superimposed on the picture signal and the thus obtained signal is broadcast as the CS television signal.

On the other hand, in CS sound broadcasting, digital data at 24 Mbps is MSK-modulated as is and the thus obtained signal is broadcast as the CS sound signal.

There is not existing at present a television-and-sound receiver capable of receiving both the CS television broadcasting and the CS sound broadcasting. We find there are the following problems when we actually produce such a receiver.

In CS television broadcasting, it is not a problem even if the frequency of an AFC circuit (Automatic Frequency Control circuit) drifts "±500 KHz" or so with respect to the carrier frequency, and hence the frequency adjustment step in the AFC circuit can be set to "100 KHz" or so. In the CS sound broadcasting, however, the carrier accuracy of the MSK demodulator must be kept within "±100 KHz" or so. Accordingly, the frequency adjustment step in the AFC circuit must be set to a frequency between "10 KHz" and "several tens of KHz".

Therefore, when an AFC circuit is so arranged as to be commonly used for the receiving circuit of the CS television broadcasting and the receiving circuit of the CS sound broadcasting, the frequency adjustment step in the AFC circuit must be set to a frequency between "10 KHz" and "several tens of KHz" so that the frequency accuracy of the AFC circuit required by the CS television broadcasting and the frequency accuracy of the AFC circuit required by the CS sound broadcasting are both satisfied.

However, while there is no problem when receiving the CS sound broadcasting with the described method, there arises a problem when receiving the CS television broadcasting because a period of time more than necessary is taken, due to the over-specification, before the receiver tunes in to a desired station, and it causes users to feel dissatisfied with the receiver.

SUMMARY OF THE INVENTION

In view of the above situation, it is an object of the present invention to provide a CS broadcast receiving system in which the tuning accuracy is increased when the CS sound broadcasting is to be received and the time required for tuning, i.e., waiting time, is shortened when the CS television broadcasting is to be received so that both the requirements for reception of the CS sound broadcasting and the requirements for reception of the CS television broadcasting can be satisfied.

In order to achieve the above mentioned object, the CS broadcast receiving system according to the present invention comprises a tuning circuit for selecting a receive signal at a frequency corresponding to. A control signal input thereto, a CS television broadcast signal demodulating circuit is provided for processing, when the receive signal selected by the tuning circuit is a CS television broadcast signal, the receive signal to reproduce a picture signal and a sound signal. A CS sound broadcast signal demodulating circuit is provided for processing, when the receive signal selected by the tuning circuit is a CS sound broadcast signal, the receive signal to reproduce a sound signal. When a station is to be selected, a control circuit causes the tuning circuit first to perform the tuning operation with the frequency adjusted in units of a coarse frequency adjustment value for reception of the CS television broadcasting. When the receive signal to be selected by the tuning circuit is not the CS television broadcast signal, the tuning circuit performs the tuning operation with the frequency adjusted in units of a fine frequency adjustment value for reception of the CS sound broadcasting.

In the above described arrangement, when a station is to be selected, the control circuit controls so that an AFC process is performed, in the first place, with the frequency in the tuning circuit adjusted in units of a coarse frequency adjustment value for reception of the CS television broadcasting. When the receive signal to be selected by the tuning circuit is not the CS television broadcast signal, the AFC process is performed with the frequency in the tuning circuit adjusted in units of a fine frequency adjustment value for reception of the CS sound broadcasting.

BRIEF DESCRIPTION OF THE DRAWINGS

FIG. 2 is a flow chart showing an example of processes performed in the CS broadcast receiving system shown in FIG. 1.

DESCRIPTION OF THE PREFERRED EMBODIMENT

Figure 1:
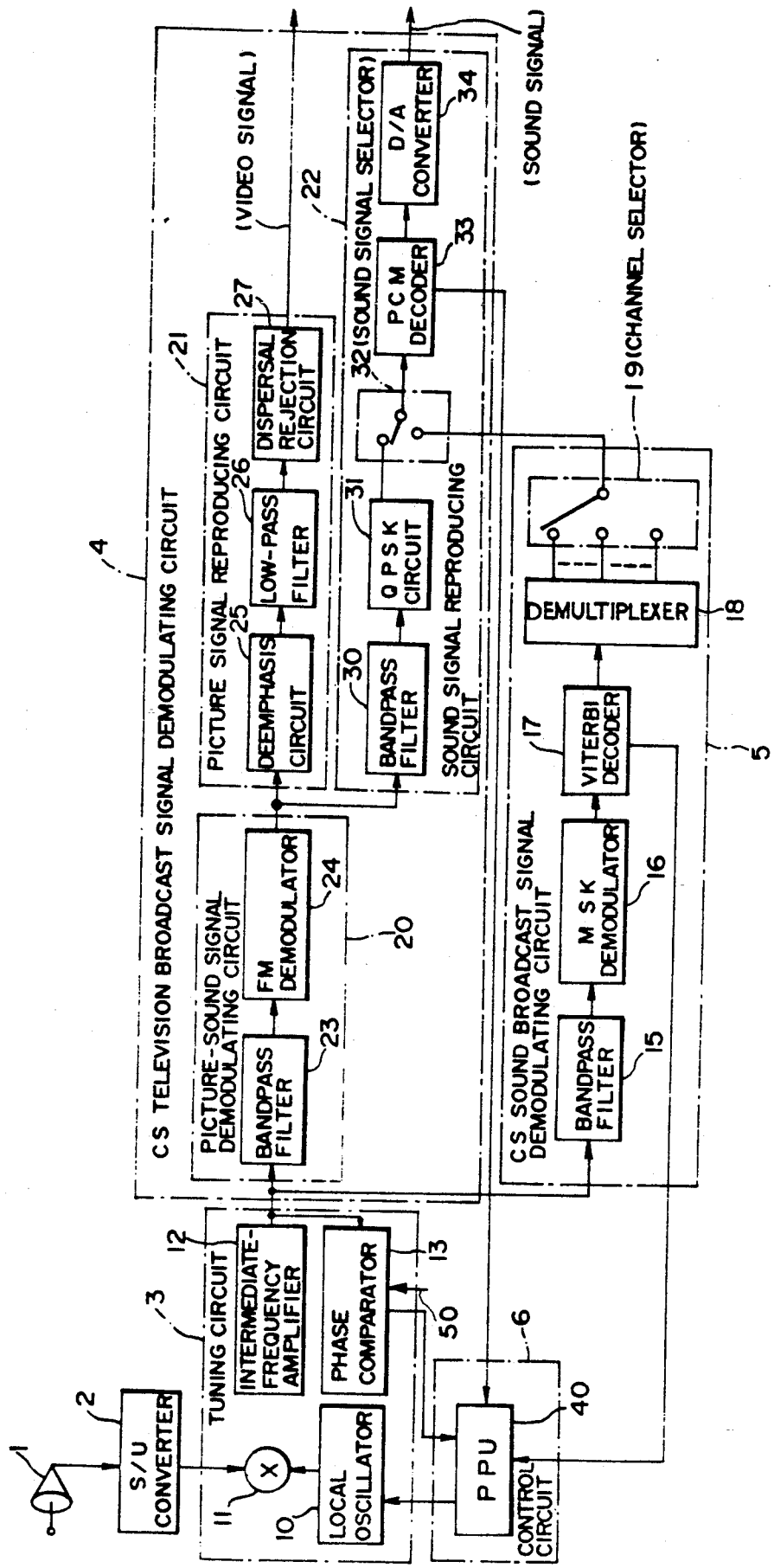
FIG. 1 is a block diagram showing an embodiment of the CS broadcast receiving system according to the present invention.

FIG. 1 is a block diagram showing an example of the CS broadcast receiving system according to the present invention.

The CS broadcast receiving system shown in FIG. 1 comprises a receiving antenna 1, an S/U (SHF/VHF) converter 2, a tuning circuit 3, a CS television broadcast signal demodulating circuit 4, a CS sound broadcast signal demodulating circuit 5, and a control circuit 6. When a tuning operation is performed, the frequency adjustment unit (the frequency adjustment step) is set to a coarse value for reception of the CS television broadcasting to shorten the time required for lock-on. When, in this state, the receiver fails in receiving a receive signal within a predetermined time, or even though the receiver succeeds in the reception of a receive signal within the predetermined time, if the CS sound broadcast signal demodulating circuit 5 is receiving a CS sound broadcast signal, the frequency adjustment unit is switched to a fine value for reception of the CS sound broadcasting so that the tuning circuit 3 performs the AFC operation for tuning in to the CS sound broadcasting, and thereby the receiver is brought into its state to receive in stable fashion the CS sound broadcasting.

The receiving antenna, which is a high-gain antenna such as a parabola antenna, receives the CS television broadcast signal or the CS sound broadcast signal and supply it to the S/U converter 2.

The S/U converter 2 accepts the CS television broadcast signal or the CS sound broadcast signal output from the antenna 1 and converts its frequency to generate a first intermediate-frequency signal at "1.3 GHz", and supplies this signal to the tuning circuit 3.

The tuning circuit 3 comprises a local oscillator 10 resonating at a frequency corresponding to a control signal output from the control circuit 6 to generate a local oscillation signal. A mixer 11 mixes the local oscillation signal output from the local oscillator 10 and the first intermediate-frequency signal output from the S/U converter 2 to thereby generate a second intermediate-frequency signal. An intermediate-frequency amplifier 12 amplifies the second intermediate-frequency signal output from the mixer 11. A phase comparator 13 compares the phase of the second intermediate-frequency signal output from the intermediate-frequency amplifier 12 and the phase of a reference frequency signal input at 50 and outputs the result of the comparison as an AFC output signal.

In the tuning circuit 3, the local oscillation signal at the frequency based on the control signal from the control circuit 6 is generated and this local oscillation signal is mixed with the first intermediate-frequency signal output from the S/U converter 2 to generate a second intermediate-frequency signal. This signal is supplied to the CS television broadcast signal demodulating circuit 4 and the CS sound broadcast signal demodulating circuit 5. At this time, an AFC output signal indicating the difference between the frequencies of the second intermediate-frequency signal and the reference frequency signal is generated to be supplied to the control circuit 6.

The CS sound broadcast signal demodulating circuit 5 comprises a bandpass filter 15 bandpassing the second intermediate-frequency signal output from the tuning circuit 3 to extract therefrom a predetermined frequency-band component (PCM CS sound signal frequency-band component). An MSK demodulator 16 MSK-demodulates the signal output from the bandpass filter 15. A Viterbi decoder 17 performs a Viterbi decoding process on the signal output from the MSK demodulator 16 and, when a PCM CS sound signal including a plurality of channels (frames) is obtained, outputs the signal and, at the same time, generates a flag FCH indicating that the PCM CS sound signal has been obtained. A demultiplexer 18 separates the PCM CS signal output from the Viterbi decoder 17 for each channel, and a channel selector 19 selects among the PCM CS signal for multiple channels output from the demultiplexer 18.

When the second intermediate-frequency signal output from the tuning circuit 3 is a CS sound broadcast signal, the band-pass filtering process, Viterbi decoding process, demultiplexing process, and selection process are sequentially performed on the second intermediate-frequency signal to reproduce the PCM CS sound signal for the specified channel. This signal is supplied to the CS television broadcast signal demodulating circuit 4, and in the meantime, when the PCM CS sound signal is obtained by the Viterbi decoder 17, the flag FCH is generated thereby and supplied to the control circuit 6.

The CS television broadcast signal demodulating circuit 4 comprises a picture-sound signal demodulating circuit 20, a picture signal reproducing circuit 21, and a sound signal reproducing circuit 22, and, when the second intermediate-frequency signal output from the tuning circuit 3 is a CS television broadcast signal, this signal is demodulated and a video signal and a TV sound signal (or a CS sound signal) are reproduced for output.

The picture-sound signal demodulating circuit 20 comprises a bandpass filter 23 bandpassing the second intermediate-frequency signal output from the tuning circuit 3 to extract therefrom a predetermined frequency-band component (a picture-sound signal frequency-band component) and an FM demodulator 24 for FM-detecting the signal output from the bandpass filter 23 to demodulate the picture signal and the TV sound signal included in the signal. When the second intermediate-frequency signal output from the tuning circuit 3 is a CS television broadcast signal, this signal is FM-demodulated to generate a picture-sound signal including both a picture signal and a TV sound signal, and this signal is supplied to the picture signal reproducing circuit 21 and the sound signal reproducing circuit 22.

The picture signal reproducing circuit 21 comprises a de-emphasis circuit 25 for accepting the picture-sound signal output from the picture-sound signal, demodulating circuit 20 and for performing a de-emphasis process on the signal. A low-pass filter 26 accepts the picture-sound signal output from the de-emphasis circuit 25 to extract therefrom the component with frequencies lower than a predetermined frequency (picture signal component). A dispersal rejection circuit (energy dispersal signal rejection circuit) 27 accepts the picture signal output from the low-pass filter 26 and rejects therefrom the dispersal component. The picture signal reproducing circuit 21 accepts the picture-sound signal output from the picture-sound signal demodulating circuit 20 and performs the de-emphasis process, low-pass filtering process, and dispersal rejection process on the accepted picture signal and generates the video signal to be output therefrom.

The sound signal reproducing circuit 22 comprises a bandpass filter 30 band-passing the picture-sound signal output from the picture-sound signal demodulating circuit 20 to extract therefrom a predetermined frequency-band component (TV sound signal component). A QPSK demodulator 31 QPSK-demodulates the TV sound signal component output from the bandpass filter 30 to reproduce the PCM TV sound signal. A sound signal selector 32 selects either the PCM TV sound signal output from the QPSK demodulator 31 or the PCM CS sound signal output from the CS sound broadcast signal demodulating circuit 5. A PCM decoder 33 PCM-decodes the PCM TV sound signal or the PCM CS sound signal selected by the sound signal selector 32 to obtain a sound signal and output the same when it is obtained, and, at the same time, generates the flag FCL indicating that the sound signal has been obtained. A D/A converter 34 D/A converts the sound signal output from the PCM decoder 33 to generate the sound signal in an analog form.

The sound signal reproducing circuit 22 accepts the picture-sound signal output from the picture-sound signal demodulating circuit 20 and performs the band-pass filtering process and QPSK-demodulating process on the picture-sound signal to reproduce a PCM TV sound signal. When the signal selected by the sound signal selector 32 is the PCM TV sound signal, the PCM TV sound signal is selected and this PCM TV sound signal is sequentially subjected to the PCM-decoding process and the D/A-converting process, whereby the sound signal corresponding to the PCM TV sound signal is reproduced and output. Meanwhile, when the sound signal is obtained by the PCM decoder 33, the flag FCL is generated and supplied to the control circuit 6.

On the other hand, when the signal selected by the sound signal selector 32 is the PCM CS sound signal, the PCM CS sound signal output from the CS sound broadcast signal demodulating circuit 5 is selected and this PCM CS sound signal is sequentially subjected to the PCM decoding process and D/A converting process, whereby the sound signal corresponding to the PCM CS sound signal is reproduced and output. Meanwhile, when the sound signal is obtained by the PCM decoder 33, the flag FCL is generated and supplied to the control circuit 6.

The control circuit 6 comprises a central processing unit 40 composed of a microprocessor performing various processes, programs specifying operations of the microprocessor, a ROM storing various constant data and the like, a RAM used for the work area etc. for the microprocessor, and others, and performs the tuning process and AFC process on the basis of the programs, processes for checking flags FCL and FCH, a process for changing the frequency adjustment unit used in the AFC process, and the like.

The signal receiving process in the present embodiment will be described below with reference to the flow chart shown in FIG. 2.

First, when a power source switch (not shown) is turned on to supply power, or a selection switch (not shown) is operated to select another station, the control circuit 6 sets the frequency adjustment unit (step) to a coarse value (e.g., 100 KHz) corresponding to the CS television broadcast signal (step ST1).

Then, the control circuit 6 starts the AFC control, switches the value of the control signal while monitoring the value of the AFC output signal from the tuning circuit 3 to thereby switch the oscillation frequency of the local oscillator 10 provided in the tuning circuit 3 (step ST2) and, at the same time, checks whether or not the flag FCL indicating that a sound signal has been reproduced is output from the PCM decoder 33 in the sound signal reproducing circuit 22 (step ST3). If the flag is not output, it checks whether or not a predetermined period of time (time-out period) has elapsed after the start of the AFC process (step ST4).

If, before the time-out period elapses (step ST4), reception of a receive signal from a specified station is attained, the value of the AFC output signal from the tuning circuit 3 comes within a preset range, and the flag FCL indicating that a sound signal has been reproduced is output from the PCM decoder 33 (step ST3). Then the control circuit 6 checks whether or not the flag FCH indicating that a PCM CS sound signal has been reproduced is output from the Viterbi decoder 17 of the CS sound broadcast signal demodulating circuit 5 (step ST5). If the flag is not output, it is decided whether the currently received receive signal is the CS television broadcast signal and the AFC process and the processes for checking the flags are repeated (steps ST2–ST5).

When the time-out period has elapsed after the start of the AFC process (step ST4), or when the flag FCL indicating that a sound signal has been reproduced is output from the PCM decoder 33 of the sound signal reproducing circuit 22 then the flag FCH indicating that the sound signal has been reproduced is output from the Viterbi decoder 17 (step ST5), and the control circuit 6 decides whether the sound signal received from the specified station is the CS sound broadcast signal and sets the frequency adjustment unit to the fine value (e.g., 20 KHz) corresponding to the CS sound broadcast signal (step ST6).

Then, the control circuit 6 starts the AFC process for tuning in to the CS sound broadcasting, switches the value of the control signal while monitoring the value of the AFC output signal from the tuning circuit 3 to thereby switch the oscillation frequency of the local oscillator 10 provided in the tuning circuit 3 (step ST7) and, at the same time, checks whether or not the flag FCH indicating that a PCM CS sound signal has been reproduced is output from the Viterbi decoder 17 (step ST8). If the flag is not output, it checks whether or not a predetermined period of time (time-out period) has elapsed after the start of the AFC process (step ST9).

If, before the time-out period elapses (step ST9) reception of a receive signal from a specified station is attained, the value of the AFC output signal from the tuning circuit 3 comes within a preset range, and the flag FCH indicating that a PCM CS sound signal has been reproduced is output from the Viterbi decoder 17. Then the control circuit 6 decides whether the reception of the CS sound broadcast signal is attained and repeats the AFC process for reception of the CS sound broadcasting, and the process for checking the flag is repeated (steps ST7–ST9).

Thereafter, if the flag FCH indicating that the PCM CS sound signal has been reproduced is output from the Viterbi decoder 17 (step ST8) or if the flag FCH is not output from the Viterbi decoder 17 within the time-out period even though the AFC process for reception of the CS sound broadcasting and the process for checking the flag are repeated (step ST9), then the control circuit 6 decides whether the reception of the CS sound broadcast signal has been ended and returns to the above described AFC process for reception of the CS television broadcasting and processes for checking the flags to execute anew the first processes (steps ST1 to ST5).

In the present embodiment, as described above, it is first arranged in selecting a station that the frequency adjustment unit is set to a coarse value for reception of the CS television broadcasting to thereby reduce the lock-on time. When the reception is not attained or when, even though the reception is attained, the flag FCH is output from the Viterbi decoder 17, the frequency adjustment unit is switched to a fine value for reception of the CS sound broadcasting to cause the tuning circuit 3 to perform the AFC operation for tuning in to the CS sound broadcasting. Therefore, while the tuning accuracy is increased for receiving the CS sound broadcasting, the time required for tuning is shortened and the waiting time is reduced when tuning in to the CS television broadcasting. Thus, both the requirements for reception of the CS sound broadcasting and the requirements for reception of the CS television broadcasting can be satisfied.

According to the present invention, as described above, it is made possible to increase the tuning accuracy when receiving the CS sound broadcasting and to shorten the tuning time and reduce the waiting time when receiving the CS television broadcasting. Therefore, the requirements for reception of the CS sound broadcasting and for reception of the CS television broadcasting can both be satisfied.

Although various minor changes and modifications might be suggested by those skilled in the art, it will be understood that we wish to include within the scope of the patent warranted hereon, all such changes and modifications as reasonably come within our contribution to the art.

What is claimed is:

1. A CS broadcast receiving system, comprising:
   a tuning circuit for selecting a receive signal at a frequency corresponding to a control signal input thereto;
   a CS television broadcast signal demodulating circuit for processing, a received signal when that received signal selected by said tuning circuit is a CS television broadcast signal, to reproduce a video signal and a first sound signal;
   a CS sound broadcast signal demodulating circuit for processing a received signal, when that received signal selected by said tuning circuit is a CS sound broadcast signal, to reproduce a second sound signal;
   a control circuit, when a station is to be selected, for causing said tuning circuit to firstly perform a tuning operation with a frequency adjusted in units of a coarse frequency adjustment value for reception of the CS television broadcast signal, and when the received signal to be selected by said tuning circuit is not the CS television broadcast signal, causing said tuning circuit to secondly perform a tuning operation with a frequency adjusted in units of a fine frequency adjustment value for reception of the CS sound broadcast signal; and
   said control circuit being connected to receive indication signals from said CS sound broadcast circuit and said CS television broadcast circuit.

* * * * *